United States Patent
Hashizume et al.

(10) Patent No.: US 10,497,581 B2
(45) Date of Patent: Dec. 3, 2019

(54) SUBSTRATE PROCESSING DEVICE

(71) Applicant: SCREEN Holdings Co., Ltd., Kyoto (JP)

(72) Inventors: Akio Hashizume, Kyoto (JP); Takashi Ota, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/401,892

(22) Filed: Jan. 9, 2017

(65) Prior Publication Data

US 2017/0117160 A1 Apr. 27, 2017

Related U.S. Application Data

(63) Continuation of application No. 14/435,558, filed as application No. PCT/JP2013/073195 on Aug. 29, 2013, now abandoned.

(30) Foreign Application Priority Data

Oct. 16, 2012 (JP) .................. 2012-229139

(51) Int. Cl.
*H01L 21/67* (2006.01)
*B05C 11/08* (2006.01)
(Continued)

(52) U.S. Cl.
CPC .......... *H01L 21/31138* (2013.01); *B05C 9/14* (2013.01); *B05C 11/08* (2013.01);
(Continued)

(58) Field of Classification Search
None
See application file for complete search history.

(56) References Cited

U.S. PATENT DOCUMENTS

| 2002/0096196 A1 | 7/2002 | Toshima et al. ............... 134/21 |
| 2007/0113872 A1* | 5/2007 | Uchida ............ H01L 21/67051 |
| | | 134/26 |

(Continued)

FOREIGN PATENT DOCUMENTS

| JP | 2002-219424 A | 8/2002 |
| JP | 2005-217226 | 8/2005 |

(Continued)

OTHER PUBLICATIONS

International Search Report dated Oct. 15, 2013 in corresponding PCT International Application No. PCT/JP2013/073195.

(Continued)

*Primary Examiner* — Allan W. Olsen
*Assistant Examiner* — Margaret D Klunk
(74) *Attorney, Agent, or Firm* — Ostrolenk Faber LLP

(57) ABSTRACT

In a substrate processing method, a substrate holding unit holds a substrate in a horizontal position, a processing liquid supplying unit supplies first and second processing liquids to the surface of the substrate held by the substrate holding unit, a substrate rotating unit rotates the substrate held by the substrate holding unit, a heater opposes the substrate held by the substrate holding unit, and a moving unit moves at least one of the substrate holding unit and the heater supporting member such that the heater and the substrate are held in two different relative positions.

20 Claims, 11 Drawing Sheets

(51) Int. Cl.
  *B08B 3/08* (2006.01)
  *H01L 21/311* (2006.01)
  *B05C 9/14* (2006.01)
  *B05C 11/10* (2006.01)
  *G03F 7/42* (2006.01)

(52) U.S. Cl.
  CPC ............ *B05C 11/1015* (2013.01); *B08B 3/08* (2013.01); *H01L 21/67034* (2013.01); *H01L 21/67051* (2013.01); *H01L 21/67109* (2013.01); *G03F 7/42* (2013.01); *H01L 21/31133* (2013.01)

(56) References Cited

U.S. PATENT DOCUMENTS

| | | | | |
|---|---|---|---|---|
| 2013/0087309 A1* | 4/2013 | Volfovski | .......... | H01L 21/67109 165/61 |
| 2014/0065295 A1* | 3/2014 | Emoto | .................. | B05D 1/005 427/8 |

FOREIGN PATENT DOCUMENTS

| | | |
|---|---|---|
| JP | 2005-277268 | 10/2005 |
| JP | 2007-173432 | 7/2007 |
| JP | 2008-004879 | 1/2008 |
| JP | 2012-156264 | 8/2012 |

OTHER PUBLICATIONS

Written Opinion dated Oct. 15, 2013 in corresponding PCT International Application No. PCT/JP2013/073195.

International Preliminary Report on Patentability (Chapter I) dated Apr. 30, 2015 and Notification from the International Bureau (Form PCT/IB/326) in corresponding PCT International Application No. PCT/JP2013/073195.

English translation of the International Preliminary Report on Patentability (Chapter I) dated Apr. 30, 2015 with Notification from the International Bureau (Form PCT/IB/338) in corresponding PCT International Application No. PCT/JP2013/073195.

* cited by examiner

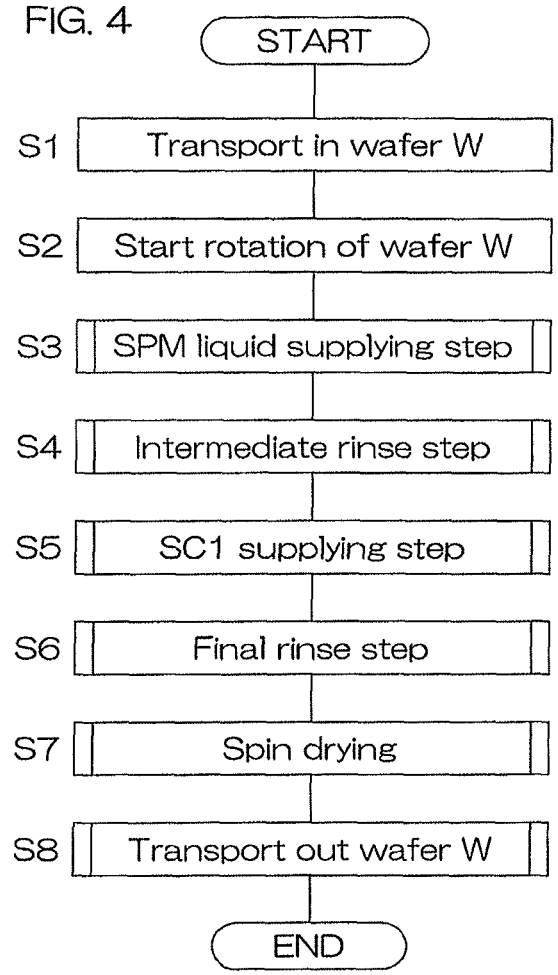

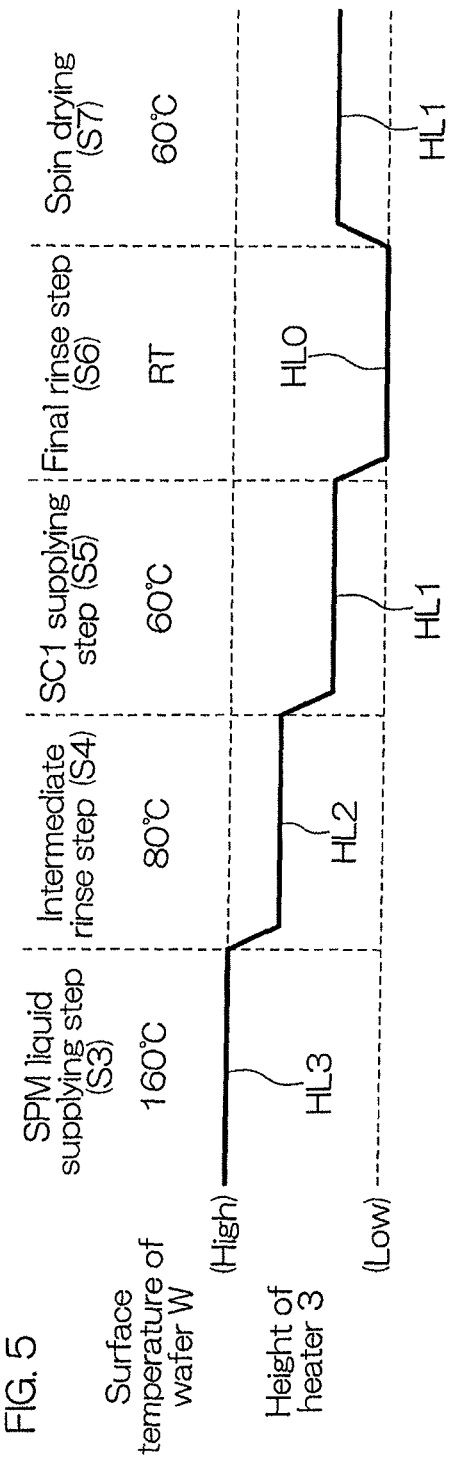

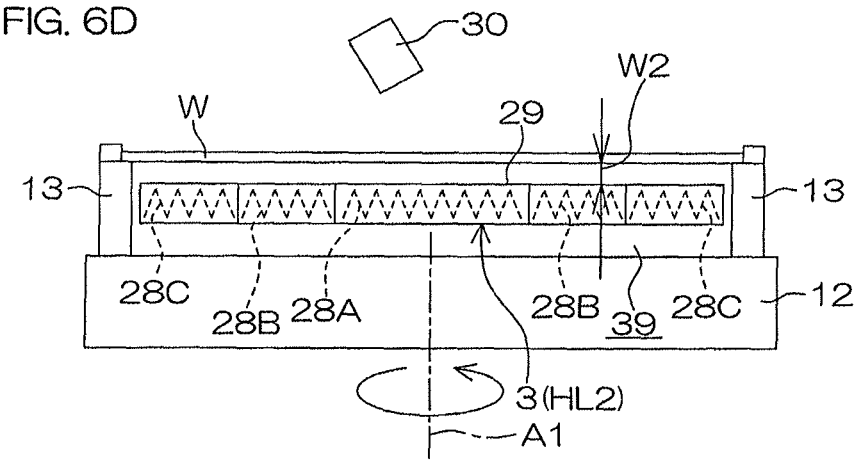
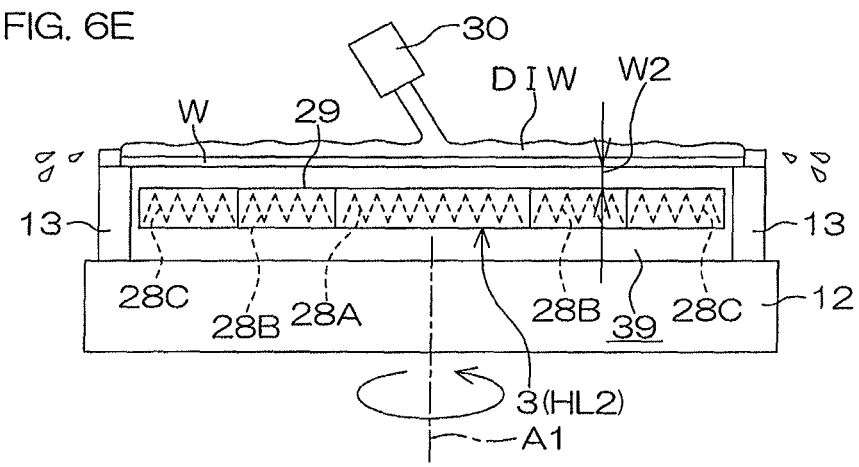
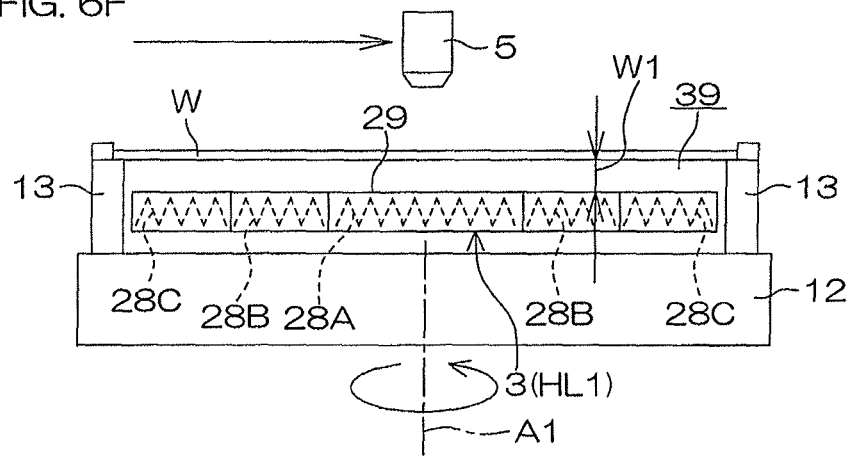

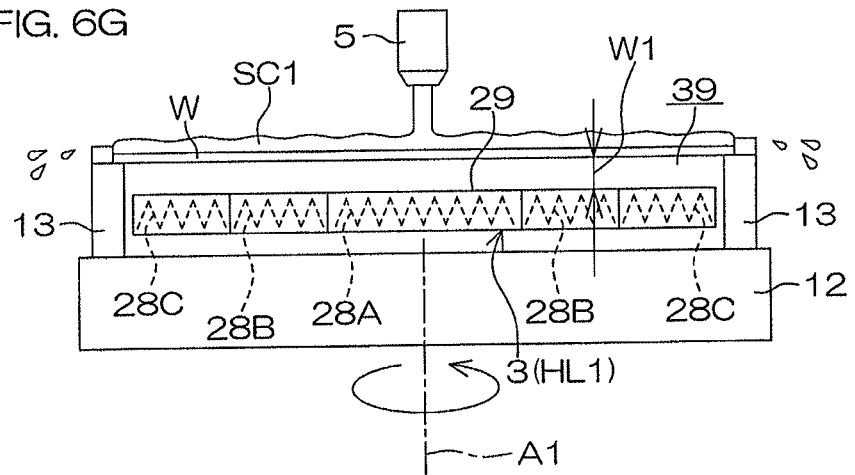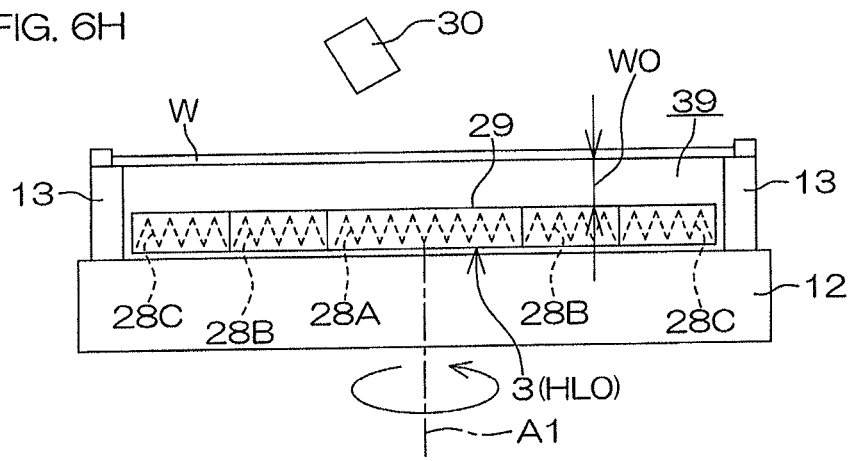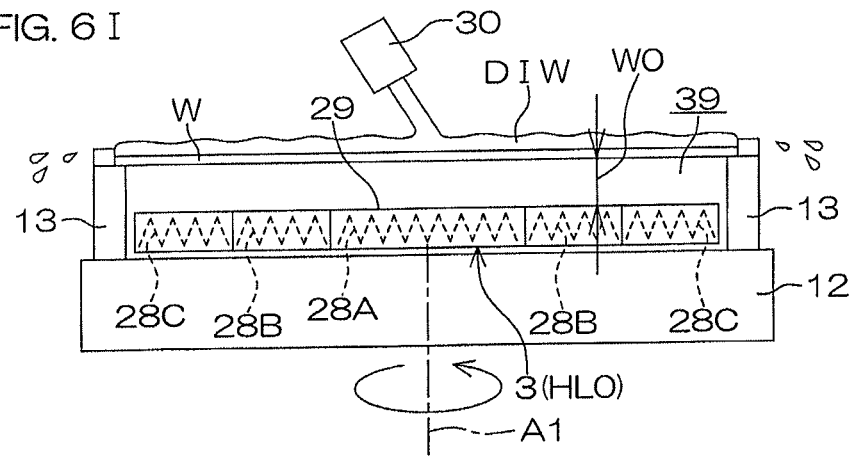

SUBSTRATE PROCESSING DEVICE

CROSS-REFERENCE TO RELATED APPLICATIONS

The present application is a continuation of U.S. patent application Ser. No. 14/435,558, filed Apr. 14, 2015, which is a 35 U.S.C. § 371 national phase conversion of PCT/JP2013/073195, filed Aug. 29, 2013, which claims priority of Japanese Patent Application No. 2012-229139, filed Oct. 16, 2012, the contents of which are incorporated by reference herein. The PCT International Application was published in the Japanese language.

TECHNICAL FIELD

The present invention relates to a substrate processing apparatus that processes substrates such as semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photomasks, ceramic substrates and substrates for solar cell.

BACKGROUND ART

In production processes for semiconductor devices or liquid crystal display devices, for example, processing for supplying a processing liquid to surfaces of substrates, such as semiconductor wafers or glass substrates for liquid crystal display panels, to clean the surface of the substrate with the processing liquid are performed.

For example, a substrate processing apparatus that performs cleaning processing of a single substrate processing type to process a single at a time includes a spin chuck that rotates the substrate while holding the substrate substantially horizontally and a nozzle that supplies a processing liquid to the surface of the substrate rotated by the spin chuck.

In the processing of the substrate, the substrate is rotated together with the spin base of the spin chuck. Then, a chemical liquid is supplied from the nozzle around the rotation center of the surface of the substrate being rotated. The chemical liquid supplied onto the surface of the substrate receives a centrifugal force produced by the rotation of the substrate and flows on the surface of the substrate toward a peripheral edge portion. In this way, the chemical liquid flows over the entire surface of the substrate, and thus chemical liquid processing on the surface of the substrate is achieved.

Then, after the chemical liquid processing, rinse processing is performed that washes away the chemical liquid adhered to the substrate with pure water. In other words, the pure water is supplied from the nozzle to the surface of the substrate that is being rotated by the spin chuck, and the pure water is spread by receiving the centrifugal force produced by the rotation of the substrate, with the result that the chemical liquid adhered to the surface of the substrate is washed away.

As the substrate processing apparatus of the single substrate processing type described above, a substrate processing apparatus as disclosed in Patent Literature 1 below is known that incorporates a heater in the spin base of the spin chuck and that heats the substrate placed on the spin base to a high temperature. Hence, the chemical liquid on the part in contact with the surface of the substrate is increased in temperature, and thus it is possible to enhance the processing capacity of the chemical liquid, with the result that the processing rate in the chemical liquid processing can be enhanced.

CITATION LIST

Patent Literature

Patent Literature 1: Japanese Patent Application Publication No. 2008-4879

SUMMARY OF INVENTION

Technical Problem

After the completion of the chemical liquid processing (high-temperature processing), when it is necessary to perform processing (low-temperature processing) at a low temperature, while the temperature of the substrate is sufficiently decreased, it is necessary to wait for the start of the low-temperature processing. However, the temperature of the heater is not decreased immediately after the heater is turned from on (driven state) to off. Hence, a certain time after the heater is turned off, the heater continues to heat the substrate. Hence, it takes a long time to sufficiently decrease the temperature of the heater, with the result that the entire processing time may be prolonged.

There is a case where in the chemical liquid processing (high-temperature processing), the surface temperature (the temperature of the heater) of the spin base is heated to an extremely high temperature. However, since power needs to be supplied via a rotating electrical contact to the heater incorporated in the rotatable spin base, the amount of power supplied to the heater is limited, with the result that there is an upper limit for the set temperature of the heater. Hence, it is likely that it is impossible to heat the substrate to a desired high temperature.

Hence, it is an object of the present invention to provide a substrate processing apparatus that can perform low-temperature processing immediately after high-temperature processing using a heater.

It is another object of the present invention to provide a substrate processing apparatus that can heat, with a heater, a substrate to a desired high-temperature.

Solution to Problem

A substrate processing apparatus according to the present invention is adapted to process a substrate, and includes a substrate holding means that holds the substrate; a processing liquid supplying means that supplies the processing liquid to a surface of the substrate held by the substrate holding means; a substrate rotating means that rotates the substrate held by the substrate holding means; a heater that is disposed opposite the substrate held by the substrate holding means and that heats the substrate; a heater supporting member that supports the heater independently of the substrate holding means and a moving means that moves at least one of the substrate holding member and the heater supporting member such that the heater and the substrate held by the substrate holding means approach/leave each other.

With this arrangement, it is possible to change the spacing between the heater and the substrate held by the substrate holding means. When the spacing between the heater and the substrate is narrow, the substrate is heated by the heater to a high temperature. Then, in this state, the spacing between the heater and the substrate is significantly increased, and thus it is possible to reduce the amount of heat given to the substrate. In this way, it is possible to cool the substrate. In other words, a short time after high-temperature processing using the heater, low-temperature processing can be performed.

Since the heater is not supported by the substrate holding means, even while the substrate is being rotated, the heater is not rotated but remains stationary. In other words, it is not necessary to provide an arrangement of a rotatable heater, and hence the supply of power to the heater does not need to be performed via a rotating electrical contact. Hence, since the amount of power supplied to the heater is not limited, it is possible to heat the substrate to a desired high temperature.

In one preferred embodiment of the invention, the heater includes an opposing surface that is parallel to and opposite the substrate held by the substrate holding means, and heats the substrate with radiation heat of the opposing surface, and the opposing surface is divided into a plurality of opposing regions that can make the amounts of heat generated per unit area differ from each other.

For example, when the opposing surface of the heater has a larger area, it is difficult to keep the temperature of the heater uniform over the entire area of the opposing surface.

With this arrangement, the opposing surface of the heater is divided into a plurality of opposing regions, and the opposing regions are individually adjusted in temperature. Hence, for example, the respective opposing regions are adjusted to be a uniform temperature, and thus it is possible to keep the entire area of the opposing surface at the uniform temperature.

In this case, preferably, the amounts of heat generated per unit area in the plurality of opposing regions are set such that as the opposing regions extend away from a rotation axis by rotation of the substrate with the substrate rotating means, the amounts are increased.

For example, when a high-temperature processing liquid is supplied from the processing liquid supplying means to the center portion on the surface of the substrate, though the processing liquid has a high temperature immediately after the processing liquid is supplied to the center portion of the surface of the substrate, in the process of flowing from the center portion of the substrate to the peripheral edge portion of the substrate, the temperature of the liquid is decreased. Hence, on the surface of the substrate, the temperature of the processing liquid is relatively high in the center portion, the temperature of the processing liquid is relatively low in the peripheral edge portion, the temperature of the center portion of the surface of the substrate is relatively high by heat exchange between the processing liquid and the ambient atmosphere and the like and the temperature of the peripheral edge portion of the surface of the substrate is relatively low. Consequently, variations in processing rate on the surface of the substrate such as in which the processing by the processing liquid proceeds fast in the center portion of the surface of the substrate and the processing by the processing liquid proceeds relatively slow in the circumferential portion of the surface of the substrate may be produced.

The amounts of heat generated per unit area in the plurality of opposing regions are set such that as the opposing regions extend away from a rotation axis by rotation of the substrate, the amounts are increased, and thus the temperature of the processing liquid can be uniform over the entire area of the substrate. In this way, over the entire area of the surface of the substrate, the uniform processing using the processing liquid can be performed.

The plurality of opposing regions may include a circular region with the rotation axis in the center and one or a plurality of annular regions that surround the outer circumference of the circular region.

In this case, preferably, at least one of the annular regions is divided into a plurality of divided regions in a circumferential direction, and the plurality of divided regions are provided such that the divided regions can make the amounts of heat generated per unit area in the opposing surface differ from each other.

When the opposing surface of the heater has a larger area, it is difficult to keep the temperature of the heater uniform in the circumferential direction of the opposing surface. However, with this arrangement, the opposing surface of the heater is divided into a plurality of opposing regions in the circumferential direction, and the opposing regions can be individually adjusted in temperature. In this way, even when the opposing surface of the heater has a larger area, it is possible to keep the opposing surface at a uniform temperature in the circumferential direction.

The substrate holding means may include a plate-shaped base portion and a substrate supporting portion that is attached to the base portion and that supports the substrate while the substrate supporting portion is spaced apart from the base portion, and the heater may be disposed so as to be housed in a space partitioned by the base portion and the substrate supported by the substrate supporting portion.

In this case, preferably, the heater supporting member includes a support rod which is inserted through the base portion without contact with the base portion in a thickness direction and whose one end is coupled to the heater. In this arrangement, the support rod is inserted through the base portion without contact with the base portion in the thickness direction. Hence, the heater disposed so as to be housed in the space between the base portion and the substrate can be supported independently of the substrate holding means. In this way, it is possible to realize the support of the heater described above with a relatively simple arrangement.

The aforementioned and other objects, features, and effects of the present invention will be clarified by the following description of preferred embodiments with reference to the accompanying drawings.

BRIEF DESCRIPTION OF DRAWINGS

FIG. 4 is a process diagram for illustrating a first processing example of a resist removing processing performed by the substrate processing apparatus shown in FIG. 1.

FIG. 5 is a timing chart for illustrating the processing example of FIG. 4.

FIGS. 6D to 6F are schematic drawings for illustrating steps following FIG. 6C.

FIGS. 6G to 6I are schematic drawings for illustrating steps following FIG. 6F.

DESCRIPTION OF EMBODIMENTS

Figure 1:
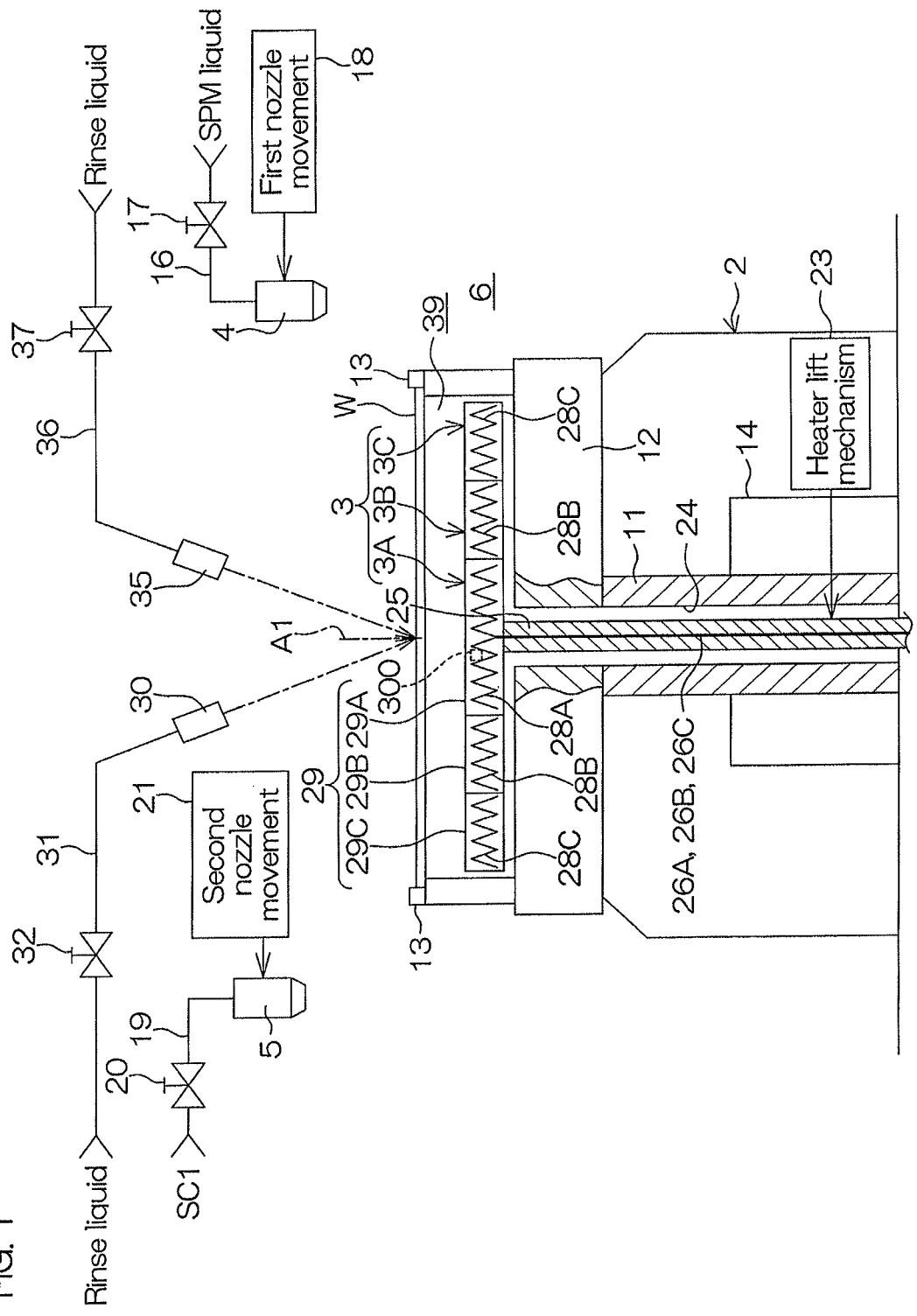
FIG. 1 is a cross-sectional view schematically showing the arrangement of a substrate processing apparatus according to a first preferred embodiment of the present invention.

FIG. 1 is a cross-sectional view schematically showing the arrangement of a substrate processing apparatus 1 according to a first preferred embodiment of the present invention. The substrate processing apparatus 1 is an apparatus of a single substrate processing type that is used in processing which removes an unnecessary resist from the surface of the wafer W, after, for example, ion implantation processing for implanting an impurity to the surface (main surface) of a silicon wafer (hereinafter referred to as a "wafer") W, which is an example of a substrate, and dry etching processing.

The substrate processing apparatus 1 includes a spin chuck (substrate holding means) 2 that holds the wafer W horizontally to rotate it within a processing chamber 6 partitioned by a dividing wall (not shown), a heater 3 that is disposed opposite the lower surface of the wafer W held by the spin chuck 2 and that heats the wafer W from below, a first chemical liquid nozzle (processing liquid supplying means) 4 that supplies a sulfuric acid/hydrogen peroxide mixture liquid (SPM liquid) to the surface (upper surface) of the wafer W held by the spin chuck 2 and a second chemical liquid nozzle (processing liquid supplying means) 5 that supplies a SC1 (ammonia-hydrogen peroxide mixture) to the surface (upper surface) of the wafer W held by the spin chuck 2.

As the spin chuck 2, for example, a clamping type spin chuck is adopted. The spin chuck 2 includes a cylindrical rotation shaft 11 that extends vertically, a disk-shaped spin base (base portion) 12 that is attached to the upper end of the rotation shaft 11 in a horizontal position, a plurality of clamping members (substrate supporting portion) 13 that are disposed on the spin base 12 and a spin motor (substrate rotating means) 14 that is coupled to the rotation shaft 11. The spin chuck 2 brings the respective clamping members 13 into contact with the circumferential end surface of the wafer W, and thereby can hold the wafer W by clamping it from the circumference. Then, with the wafer W held by the plurality of clamping members 13, the rotation drive force of the spin motor 14 is input to the rotation shaft 11, and thus the wafer W is rotated around a vertical rotation axis A1 that passes through the center of the wafer W.

The first chemical liquid nozzle 4 is, for example, a straight type nozzle that discharges the SPM liquid in a state of continuous flow. A SPM liquid supplying pipe 16 through which a predetermined high-temperature (for example, about 160° C.) SPM liquid is supplied from a SPM liquid supply source is connected to the first chemical liquid nozzle 4. A SPM liquid valve 17 for opening and closing the SPM liquid supplying pipe 16 is provided in the SPM liquid supplying pipe 16. When the SPM liquid valve 17 is opened, the SPM liquid is supplied from the SPM liquid supplying pipe 16 to the first chemical liquid nozzle 4 whereas when the SPM liquid valve 17 is closed, the supply of the SPM liquid from the SPM liquid supplying pipe 16 to the first chemical liquid nozzle 4 is stopped. A first nozzle movement mechanism 18 is coupled to the first chemical liquid nozzle 4. The first nozzle movement mechanism 18 moves the first chemical liquid nozzle 4 between an upper position (on the rotation axis A1) of the rotation center of the wafer W held by the spin chuck 2 and a home position provided in a position on the side of the spin chuck 2.

The second chemical liquid nozzle 5 is, for example, a straight type nozzle that discharges the SC1 in a state of continuous flow. A SC1 supplying pipe 19 through which the SC1 whose temperature is adjusted to a predetermined high temperature (for example, about 60° C.) is supplied from a SC1 supply source is connected to the second chemical liquid nozzle 5. A SC1 valve 20 for opening and closing the SC1 supplying pipe 19 is provided in the SC1 supplying pipe 19. When the SC1 valve 20 is opened, the SC1 is supplied from the SC1 supplying pipe 19 to the second chemical liquid nozzle 5 whereas when the SC1 valve 20 is closed, the supply of the SC1 from the SC1 supplying pipe 19 to the second chemical liquid nozzle 5 is stopped. A second nozzle movement mechanism 21 is coupled to the second chemical liquid nozzle 5. The second nozzle movement mechanism 21 moves the second chemical liquid nozzle 5 between the upper position (on the rotation axis A1) of the rotation center of the wafer W held by the spin chuck 2 and the home position provided in a position on the side of the spin chuck 2.

The substrate processing apparatus 1 further includes a room-temperature rinse liquid nozzle (processing liquid supplying means) 30 and a high-temperature rinse liquid nozzle (processing liquid supplying means) 35. The room-temperature rinse liquid nozzle 30 is a straight type nozzle that discharges DIW (deionized water), which is an example of the rinse liquid, in a state of continuous flow. The DIW of room temperature (for example, about 25° C., the same temperature as the room temperature (RT) of the processing chamber 6) is discharged from the room-temperature rinse liquid nozzle 30. The room-temperature rinse liquid nozzle 30 is disposed with its discharge port facing the center portion on the upper surface of the wafer W held by the spin chuck 2. A room-temperature rinse liquid supplying pipe 31 through which the DIW whose temperature is maintained at room temperature is supplied from a rinse liquid supply source is connected to the room-temperature rinse liquid nozzle 30. A room-temperature rinse liquid valve 32 for opening and closing the room-temperature rinse liquid supplying pipe 31 is provided in the room-temperature rinse liquid supplying pipe 31. When the room-temperature rinse liquid valve 32 is opened, the DIW of room temperature is supplied from the room-temperature rinse liquid supplying pipe 31 to the room-temperature rinse liquid nozzle 30, and the DIW of room temperature is discharged from the room-temperature rinse liquid nozzle 30 to the center portion on the upper surface of the wafer W.

The high-temperature rinse liquid nozzle 35 is, for example, a straight type nozzle that discharges the DIW (deionized water), which is an example of the rinse liquid, in a state of continuous flow. The DIW of a predetermined high temperature (for example, about 80° C.) is discharged from the high-temperature rinse liquid nozzle 35. The high-temperature rinse liquid nozzle 35 is disposed with its discharge port facing the center portion on the upper surface of the wafer W held by the spin chuck 2. A high-temperature rinse liquid supplying pipe 36 through which the DIW whose temperature is heated to a high temperature is supplied from a rinse liquid supply source is connected to the high-temperature rinse liquid nozzle 35. A high-temperature rinse liquid valve 37 for opening and closing the high-temperature rinse liquid supplying pipe 36 is provided in the high-temperature rinse liquid supplying pipe 36. When the high-temperature rinse liquid valve 37 is opened, the DIW of high temperature is supplied from the high-temperature rinse liquid supplying pipe 36 to the high-temperature rinse liquid nozzle 35, and the DIW of high temperature is discharged from the high-temperature rinse liquid nozzle 35 to the center portion on the upper surface of the wafer W.

The heater 3 has a disk shape whose diameter is substantially equal to that of the wafer W or is slightly smaller than that of the wafer W, and has a horizontal position. The heater 3 includes a first heater plate 3A that is disk-shaped concentrically with the rotation axis A1, an annular second heater plate 3B that surrounds the outer circumference of the first heater plate 3A and an annular third heater plate 3C that surrounds the outer circumference of the second heater plate 3B. The heater 3 is disposed in a space 39 between the upper surface of the spin base 12 and the lower surface of the wafer W held by the spin chuck 2.

Figure 2:
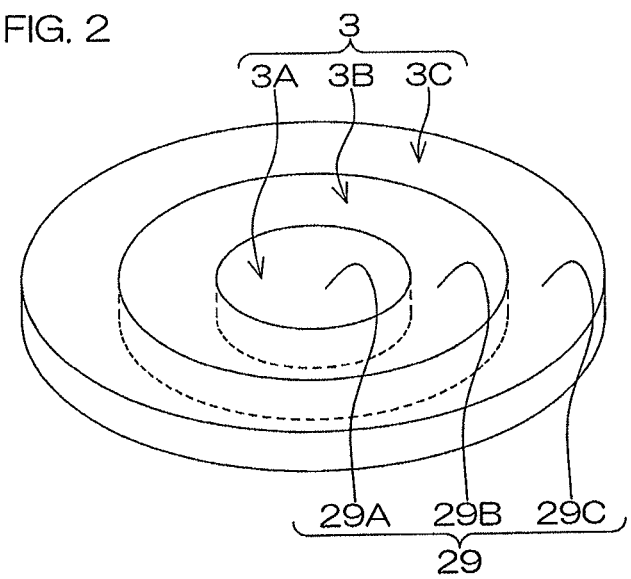
FIG. 2 is a perspective view showing the arrangement of a heater shown in FIG. 1.

FIG. 2 is a perspective view showing the arrangement of the heater 3. The heater 3 will be described with reference to FIGS. 1 and 2.

The first heater plate 3A is disk-shaped, and a first resistor 28A (see FIG. 1) is incorporated in a main body made of ceramic. On the upper surface of the first heater plate 3A, a first opposing surface (circular region) 29A that is horizontally flat and is circular is formed.

The second heater plate 3B is annular plate-shaped, and a second resistor 28B (see FIG. 1) is incorporated in a main body made of ceramic. On the upper surface of the second heater plate 3B, a second opposing surface (annular region) 29B that is horizontally flat and is annular is formed.

The third heater plate 3C is annular plate-shaped, and a third resistor 28C (see FIG. 1) is incorporated in a main body made of ceramic. On the upper surface of the third heater plate 3C, a third opposing surface (annular region) 29C that is horizontally flat and is annular is formed.

The second heater plate 3B is coupled and fixed via a coupling unit (not shown) to the first heater plate 3A. In its fixed state, there is little clearance between the inner circumference of the second heater plate 3B and the outer circumference of the first heater plate 3A. The third heater plate 3C is coupled and fixed via a coupling unit (not shown) to the second heater plate 3B. In its fixed state, there is little clearance between the inner circumference of the third heater plate 3C and the outer circumference of the second heater plate 3B.

With the first to third heater plates 3A to 3C coupled to each other, first to third opposing surfaces 29A to 29C are included in the same horizontal surface. The first opposing surface 29A is opposite a center region (circular region having about one third of the wafer diameter with the rotation center of the wafer W as the center) on the lower surface of the wafer W. The second opposing surface 29B is opposite a middle region (region other than the center region and an outer circumferential region, which will be subsequently described) on the lower surface of the wafer W. The third opposing surface 29C is opposite the outer circumferential region (outside region of a circle, with the rotation center of the wafer W as the center, having about two thirds of the diameter of the wafer W) on the lower surface of the wafer W. The heater 3 is supported by a support rod (heater supporting member) 25 from below.

The support rod 25 is inserted, through a through hole 24 passing through the spin base 12 and the rotation shaft 11 in a vertical direction, along the rotation axis A1 in the a vertical direction (the direction of the thickness of the spin base 12). The upper end (one end) of the support rod 25 is fixed to the heater 3. The lower end (the other end) of the support rod 25 is fixed to a peripheral member below the spin chuck 2, and thus the support rod 25 is held in a vertical position. The support rod 25 is not in contact with the spin base 12 or the rotation shaft 11 within the through hole 24, and thus the heater 3 is not supported by the spin chuck 2. In other words, the heater 3 and the spin chuck 2 are independent of each other. Hence, even when the spin chuck 2 rotates the wafer W, the heater 3 is not rotated but remains stationary (non-rotation state).

A feeder 26A for the first resistor 28A, a feeder 26B for the second resistor 28B and a feeder 26C for the third resistor 28C are inserted through the through hole 24. The upper ends of the feeders 26A, 26B and 26C are connected to the first, second and third resistors 28A, 28B and 28C, respectively. In the substrate processing apparatus 1, the power supply to the resistors 28A, 28B and 28C is performed without intervention of a rotating electrical contact.

If a rotatable heater is adopted, it is necessary to perform power supply to the heater via a rotating electrical contact. In this case, since the power supply is performed with intervention of the rotating electrical contact, the amount of power supply to the heater is limited, with the result that there is a possibility that wafer W cannot be heated to a desired high temperature.

On the other hand, in the substrate processing apparatus 1, since the power supply to the resistors 28A, 28B and 28C is performed without intervention of a rotating electrical contact, the amount of power supply is not limited. In this way, it is possible to heat the wafer W to a desired high temperature.

Power is supplied to the first resistor 28A, thus the first resistor 28A generates heat and the first heater plate 3A is brought into a heated state. In this way, the first opposing surface 29A functions as a heat generating surface. Power is supplied to the second resistor 28B, thus the second resistor 28B generates heat and the second heater plate 3B is brought into a heated state. In this way, the second opposing surface 29B functions as a heat generating surface. Furthermore, power is supplied to the third resistor 28C, thus the third resistor 28C generates heat and the third heater plate 3C is brought into a heated state. In this way, the third opposing surface 29C functions as a heat generating surface. The first opposing surface 29A, the second opposing surface 29B and the third opposing surface 29C constitute an opposing surface 29. Here, the power supply to the first, second and third resistors 28A, 28B and 28C is individually performed, and the amount of power to each of the resistors 28A, 28B and 28C is individually controlled. Hence, it is possible to individually control the amount of heat generated (the surface temperatures of the first opposing surface 29A, the second opposing surface 29B and the third opposing surface 29C) by the first, second and third heater plates 3A, 3B and 3C.

A heater lift mechanism (moving means) 23 that raises and lowers the heater 3 while maintaining the horizontal position is coupled to the support rod 25. The heater lift mechanism 23 is arranged with, for example, a ball screw and a motor. By the drive of the heater lift mechanism 23, the heater 3 is raised and lowered between a zero height position (leaving position, see FIG. 6A and the like) HL0 where its lower surface is separate from the upper surface of the spin base 12 with a predetermined minute spacing left therebetween and a third height position (close position, see FIG. 6B and the like) HL3 where the opposing surface 29 of the heater 3 is disposed to oppose the lower surface of the wafer W with a minute spacing W3. In this way, it is possible to change the spacing between the heater 3 and the wafer W.

Figure 3:
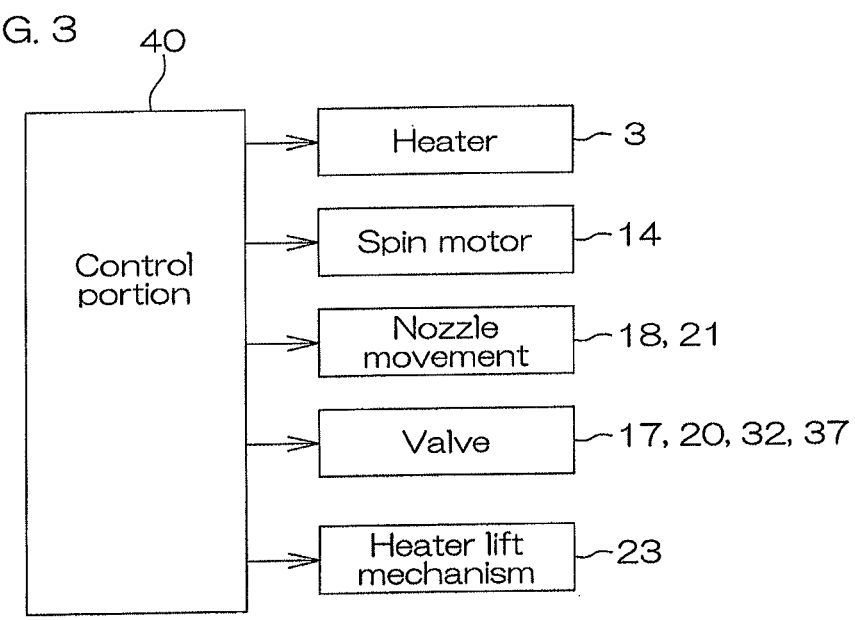
FIG. 3 is a block diagram showing the electrical arrangement of the substrate processing apparatus shown in FIG. 1.

FIG. 3 is a block diagram showing the electrical arrangement of the substrate processing apparatus 1.

The substrate processing apparatus 1 has a control portion 40 including a microcomputer. The control portion 40 controls the operations of the spin motor 14, the first and second nozzle movement mechanisms 18 and 21 and the like. The control portion 40 controls the amount of heat generated by the heater 3. The control portion 40 controls the opening and closing operation on the SPM liquid valve 17, the SC1 valve 20, the room-temperature rinse liquid valve 32 and the high-temperature rinse liquid valve 37.

FIG. 4 is a process diagram for illustrating a first processing example of a resist removing processing performed by the substrate processing apparatus 1. FIG. 5 is a timing chart for mainly illustrating the details of control by the control portion 40 from a SPM liquid supplying step in step S3 to spin drying in step S7, which will be subsequently described. FIGS. 6A to 6J are schematic drawings for illustrating the first processing example. In FIGS. 6A to 6J, the illustration of the arrangement below the spin base 12 is omitted.

The first processing example of the resist removing processing will be described below with reference to FIGS. 1 to 5 and FIGS. 6A to 6J.

In the preferred embodiment, with respect to the first, second and third heater plates 3A, 3B and 3C of the heater 3 in an on-state, the amount of heat generated per unit area of the third opposing surface 29C is set higher than the amount of heat generated per unit area of the second opposing surface 29B. The amount of heat generated per unit area of the second opposing surface 29B is set higher than the amount of heat generated per unit area of the first opposing surface 29A. In other words, the amount of heat generated per unit area of the first to third opposing surfaces 29A, 29B and 29C is set such that it is increased as they extend away from the rotation axis A1. From a different point of view, the temperature TC1 of the third opposing surface 29C is set higher than the surface temperature TB1 of the second opposing surface 29B, and the surface temperature TB1 of the second opposing surface 29B is set higher than the surface temperature TA1 of the first opposing surface 29A (TC1>TB1>TA1).

When the heater 3 is turned on, the heater 3 is disposed close to the wafer W, and thus the wafer W is heated by the heater 3.

Figure 6A:
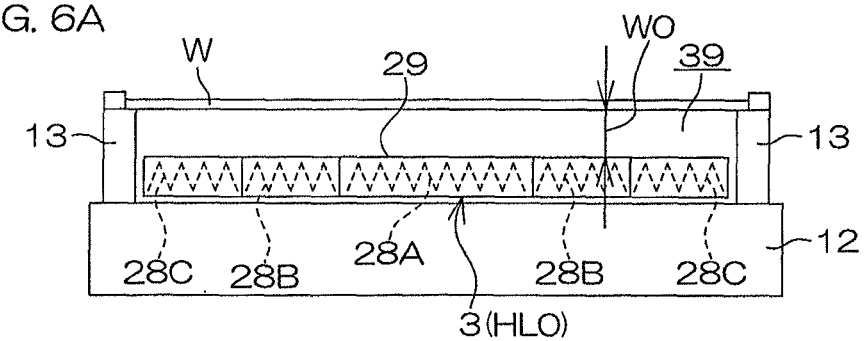
FIGS. 6A to 6C are schematic drawings for illustrating the processing example of FIG. 4.

In the resist removing processing, a transport robot (not shown) is controlled, and the unprocessed wafer W is transported into the processing chamber 6 (see FIG. 1) (step S1). As shown in FIG. 6A, the wafer W is passed to the spin chuck 2 with its surface facing upward. Here, the heater 3 has already been turned on (driven state), and the height position of the heater 3 is the zero height level HL0. Furthermore, the first and second chemical liquid nozzles 4 and 5 are disposed in the home position so as not to interfere with the transport of the wafer W. In the first processing example, during the resist removing processing, the amount of heat generated per unit area of each of the first to third opposing surfaces 29A, 29B and 29C is kept at a previously set value. In other words, the output level of the heater 3 is not changed.

Figure 6B:
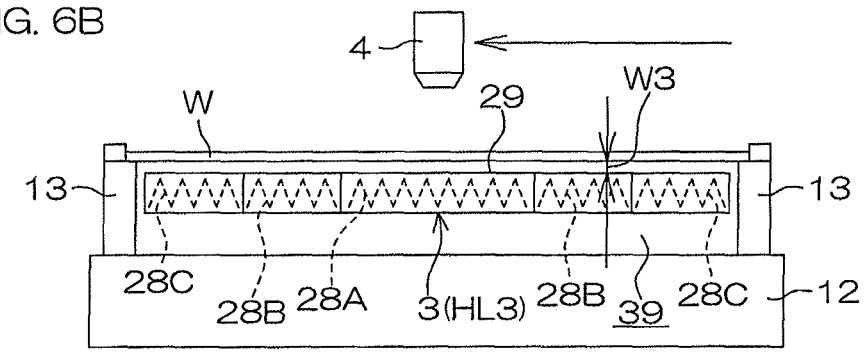

When the wafer W is held by the spin chuck 2, as shown in FIG. 6B, the control portion 40 controls the heater lift mechanism 23 to raise the heater 3 to the third height level HL3, which is the uppermost level by controlling the heater lift mechanism 23. When the heater 3 is at the third height level HL3, the spacing W3 between the lower surface of the wafer W held by the spin chuck 2 and the opposing surface 29 of the heater 3 is, for example, 0.5 mm.

The wafer W held by the spin chuck 2 with the heater 3 at the third height level HL3 is heated with radiation heat from the heater 3. After the heater 3 is raised, the first, second and third opposing surfaces 29A, 29B and 29C are parallel to the lower surface of the wafer W. Hence, the amount of heat per unit area given by the heater 3 to a part of the wafer W opposing the third opposing surface 29C is higher than the amount of heat per unit area given to a part of the wafer W opposing the second opposing surface 29B. The amount of heat per unit area given by the heater 3 to the part of the wafer W opposing the second opposing surface 29B is higher than the amount of heat per unit area given to a part of the wafer W opposing the first opposing surface 29A. In other words, the amount of heat per unit area given to the wafer W is set higher as the opposing surface extends away from the rotation axis A1. Although variations in temperature of the wafer W are produced through the heating by the heater 3, the surface temperature of the wafer W is heated to about 160° C.

The control portion 40 controls the first nozzle movement mechanism 18 to move the first chemical liquid nozzle 4 above the rotation center of the wafer W.

Figure 6C:
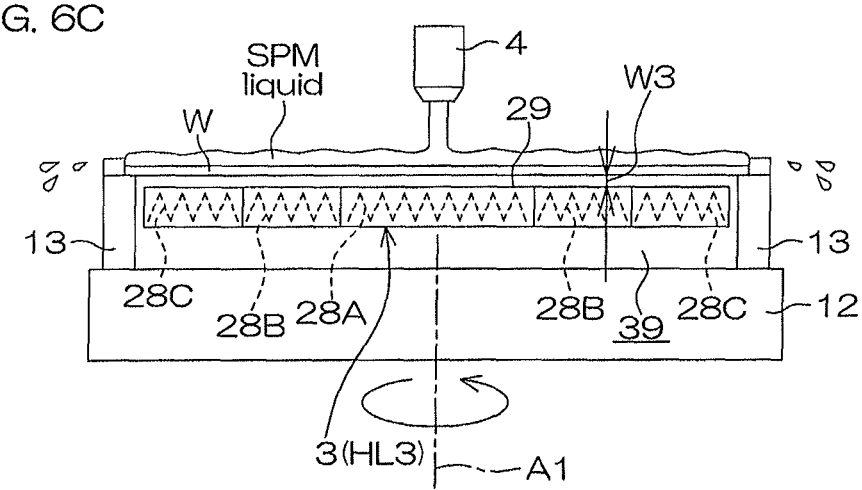

When the raising of the heater 3 is completed, as shown in FIG. 6C, the control portion 40 controls the spin motor 14 to start the rotation of the wafer W (step S2). The wafer W is accelerated to a predetermined liquid processing speed (for example, 500 to 1000 rpm), and thereafter is maintained at the liquid processing speed.

When the movement of the first chemical liquid nozzle 4 is completed, as shown in FIG. 6C, the control portion 40 opens the SPM liquid valve 17 to discharge the SPM liquid of, for example, 160° C. from the first chemical liquid nozzle 4. The SPM liquid discharged from the first chemical liquid nozzle 4 is supplied to the center portion of the surface of the wafer W being rotated (step S3: the SPM liquid supplying step). The SPM liquid supplied to the surface of the wafer W receives a centrifugal force produced by the rotation of the wafer W, and flows to the peripheral edge portion on the surface of the wafer W. In this way, the SPM liquid is spread over the entire surface of the wafer W, and the resist formed on the surface of the wafer W is peeled by the strong oxidizing power of peroxomonosulfuric acid contained in the SPM liquid. The resist is lifted off from the surface of the wafer W is made to flow away by the SPM liquid and is removed from the surface of the wafer W. In this way, the reaction between the resist on the surface of the wafer W and the SPM liquid is facilitated, and the removal of the resist from the surface of the wafer W proceeds.

The SPM liquid supplied to the center portion of the surface of the wafer W performs heat exchange with the ambient atmosphere and the like. Hence, in the course of flowing from the center portion of the surface of the wafer W to the peripheral edge portion, heat is removed from the wafer W to the SPM liquid. Then, as a result of the heat exchange between the SPM liquid and the wafer W, heat may be removed from the peripheral edge portion of the wafer W. The amount of heat removed from the wafer W is increased as the surface of the wafer W extends to the peripheral edge portion of the surface of the wafer W.

However, in the preferred embodiment, as the wafer W extends away from the rotation axis A1, a higher amount of heat per unit area is given to the wafer W. More specifically, here, the amount of heat generated per unit area of the first, second and third opposing surfaces 29A, 29B and 29C is set such that the amount of heat given to the wafer W and the amount of heat removed from the wafer W are uniform in the individual portions of the wafer W. Consequently, the surface temperature of the wafer W is distributed uniformly over the entire area at about 160° C. In this way, the processing using the SPM liquid can be performed over the entire surface of the wafer W.

When a predetermined resist removal time has elapsed since the start of the discharge of the SPM liquid from the first chemical liquid nozzle 4, the control portion 40 closes the SPM liquid valve 17 to return the first chemical liquid nozzle 4 from the rotation center of the wafer W to the home position. As shown in FIG. 6D, the control portion 40 controls the heater lift mechanism 23 to lower the heater 3 to a second height level HL2 that is a height position lower than the third height level HL3. When the heater 3 is at the second height level HL2, a spacing W2 between the lower surface of the wafer W held by the spin chuck 2 and the opposing surface 29 of the heater 3 is about 10 mm. In this state, although variations in temperature are produced by the radiation heat from the heater 3, the wafer W held by the spin chuck 2 is heated to about 80° C. In other words, the wafer W whose temperature is about 160° C. is cooled by the lowering of the heater 3.

Then, while the rotation speed of the wafer W is being maintained at the liquid processing speed, as shown in FIG. 6E, the control portion 40 opens the high-temperature rinse liquid valve 37 to supply the DIW of about 80° C. from the discharge port of the high-temperature rinse liquid nozzle 35 to around the rotation center of the wafer W (step S4: an intermediate rinse step). The DIW supplied to the surface of the wafer W receives the centrifugal force produced by the rotation of the wafer W, and flows to the peripheral edge portion on the surface of the wafer W. In this way, the SPM liquid adhered to the surface of the wafer W is washed away. Here, since heat from the heater 3 is given via the wafer W to the DIW flowing on the surface, the DIW is prevented from being lowered in temperature from about 80° C., and flows to the peripheral edge portion of the wafer W.

The wafer W may be damaged if the DIW of room temperature is suddenly supplied to the wafer W whose temperature has so far been heated to a high temperature of about 160° C. Hence, the DIW whose temperature is warmed at about 80° C. is used to perform rinsing. However, even in this case, it is necessary to wait for the start of the intermediate rinse step in step S4 until the wafer W is lowered in temperature to at least about 90° C.

However, the heater 3 is not lowered in temperature immediately after the heater 3 is turned from on to off. Hence, when the heater 3 is disposed at the third height level HL3, for a certain time after the heater 3 is turned off, the heater 3 continues to heat the wafer W with a large amount of heat. Hence, it is necessary to take a considerably long time to sufficiently lower the temperature of the heater 3, with the result that the processing time of the entire resist removing processing may be prolonged.

On the other hand, in the preferred embodiment, after the completion of the SPM liquid supplying step in step S3, the spacing between the heater 3 and the wafer W is increased from the spacing W3 to the spacing W2, thus reducing the added amount of heat to the wafer W. In this way, it is possible to cool the wafer W. Consequently, within a short time after the completion of the SPM liquid supplying step in step S3, it is possible to start the intermediate rinse step in step S4.

When the supply of the DIW is continued over a predetermined intermediate rinse time, the high-temperature rinse liquid valve 37 is closed, and the supply of the DIW to the surface of the wafer W is stopped. As shown in FIG. 6F, the control portion 40 controls the heater lift mechanism 23 to lower the heater 3 to a first height level HL1 that is a height position lower than the second height level HL2. When the heater 3 is at the first height level HL1, the spacing W1 between the lower surface of the wafer W held by the spin chuck 2 and the opposing surface 29 of the heater 3 is, for example, 20 mm.

The wafer W held by the spin chuck 2 with the heater 3 at the first height level HL1 is heated with the radiation heat from the heater 3. When the heater 3 is lowered to the first height level HL1, the first, second and third opposing surfaces 29A, 29B and 29C are parallel to the lower surface of the wafer W. Hence, the amount of heat per unit area given by the heater 3 to the part of the wafer W opposing the third opposing surface 29C is higher than the amount of heat per unit area given to the part of the wafer W opposing the second opposing surface 29B. The amount of heat per unit area given by the heater 3 to the part of the wafer W opposing the second opposing surface 29B is higher than the amount of heat per unit area given to the part of the wafer W opposing the first opposing surface 29A. In other words, the amount of heat per unit area given to the wafer W is set higher as the opposing surface extends away from the rotation axis A1. Although variations in temperature of the wafer W are produced through the heating by the heater 3, the surface temperature of the wafer W is heated to about 60° C. In other words, the surface temperature of the wafer W is lowered from about 80° C. as it is to about 60° C. by the lowering of the heater 3. The control portion 40 controls the second nozzle movement mechanism 21 to move the second chemical liquid nozzle 5 to a position above the wafer W.

After the completion of the movement of the second chemical liquid nozzle 5, as shown in FIG. 6G, the control portion 40 opens the SC1 valve 20 to discharge the SC1 of, for example, about 60° C. from the second chemical liquid nozzle 5. Since the SC1 has a liquid temperature of about 60° C., the processing capacity of the SC1 is high. The SC1 discharged from the second chemical liquid nozzle 5 is supplied to the center portion on the surface of the wafer W being rotated (step S5: a SC1 supplying step). The SC1 supplied to the surface of the wafer W receives the centrifugal force produced by the rotation of the wafer W, and flows to the peripheral edge portion on the surface of the wafer W. In this way, the SC1 is supplied to the entire surface of the wafer W uniformly, and it is possible to remove, by the chemical capability of the SC1, foreign matter such as a resist residue and particles adhered to the surface of the wafer W.

The SC1 liquid supplied to the center portion of the surface of the wafer W performs heat exchange with the ambient atmosphere and the like. Hence, in the course of flowing from the center portion on the surface of the wafer W to the peripheral edge portion, heat is removed from the wafer W to the SC1. Then, as a result of the heat exchange between the SC1 and the wafer W, heat may be removed from the peripheral edge portion of the wafer W. The amount of heat removed from the wafer W is increased as the surface of the wafer W extends to the peripheral edge portion.

However, in the preferred embodiment, as the wafer W extends away from the rotation axis A1, a higher amount of heat per unit area is given to the wafer W. More specifically, here, the amount of heat generated per unit area of the first, second and third opposing surfaces 29A, 29B and 29C is set such that the amount of heat given to the wafer W and the amount of heat removed from the wafer W are uniform in the individual portions of the wafer W. Consequently, the surface temperature of the wafer W is distributed uniformly over the entire area at about 60° C. In this way, the processing using the SC1 can be performed over the entire surface of the wafer W.

When the supply of the SC1 is continued over a predetermined SC1 supply time, the control portion 40 closes the SC1 valve 20. As shown in FIG. 6H, the control portion 40 controls the heater lift mechanism 23 to lower the heater 3 to the zero height level HL0 that is a height position lower than the first height level HL1. When the heater 3 is at the zero height level HL0, a spacing W0 between the lower surface of the wafer W held by the spin chuck 2 and the opposing surface 29 of the heater 3 is, for example, 40 mm. In this state, the spacing between the heater 3 and the wafer W held by the spin chuck 2 is excessively extended, and thus only a small amount of radiation heat reaches the wafer W from the heater 3, with the result that the effect on the wafer W is small. In other words, the wafer W is not heated by the heater 3. Here, the surface temperature of the wafer W remains a room temperature.

Then, with the rotation speed of the wafer W maintained at the liquid processing speed, as shown in FIG. 6I, the control portion 40 opens the room-temperature rinse liquid valve 32 to supply the DIW of room temperature from the discharge port of the room-temperature rinse liquid nozzle 30 to around the rotation center of the wafer W (step S6: a final rinse step). The DIW supplied to the surface of the wafer W receives the centrifugal force produced by the rotation of the wafer W, and flows to the peripheral edge portion of the wafer W on the surface of the wafer W. In this way, the SC1 adhered to the surface of the wafer W is washed away.

Here, since the surface temperature of the wafer W is a room temperature, the DIW is prevented from being heated via the wafer W.

In the intermediate rinse step of step S4 and the final rinse step of step S6, instead of the DIW, as the rinse liquid, carbonated water, electrolytic ion water, ozone water, reduced water (hydrogen water), magnetic water or the like can be adopted.

Then, although the spin drying (step S7), which will be subsequently described, is performed, as shown in FIG. 6H, before the spin drying is performed, the control portion 40 controls the heater lift mechanism 23 to raise the heater 3 from the zero height level HL0 to the first height level HL1.

Figure 6J:
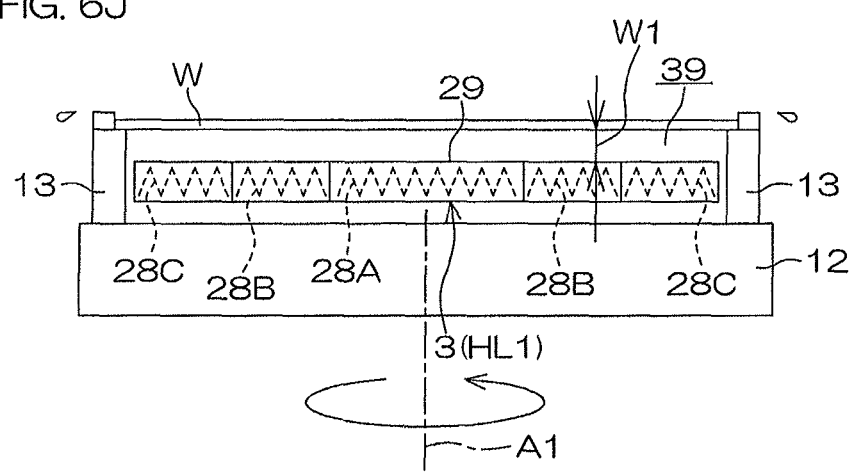
FIG. 6J is a schematic drawing for illustrating a step following FIG. 6I.

After the heater 3 is disposed at the first height level HL1, as shown in FIG. 6J, the control portion 40 drives the spin motor 14 to increase the rotation speed of the wafer W to a predetermined high rotation speed (for example, 1500 to 2500 rpm), and swings away the DIW adhered to the wafer W to perform the spin drying (step S7). By the spin drying, the DIW adhered to the wafer W is removed.

Although variations in temperature of the wafer W are produced by the radiation heat from the heater 3 at the first height level HL1, the surface temperature of the wafer W is heated to about 60° C. Hence, the DIW adhered to the wafer W is more likely to be evaporated, and thus it is possible to reduce the time necessary for the spin drying.

When the spin drying is performed for a previously determined spin drying time, the control portion 40 drives the spin motor 14 to stop the rotation of the spin chuck 2.

The control portion 40 also turns off the heater 3 (non-driven state) and controls the heater lift mechanism 23 to lower the heater 3 to the zero height level HL0. In this way, the resist removing processing for one wafer W is completed, and the processed wafer W is transported by the transport robot from the processing chamber 6 (step S8).

Figure 7:
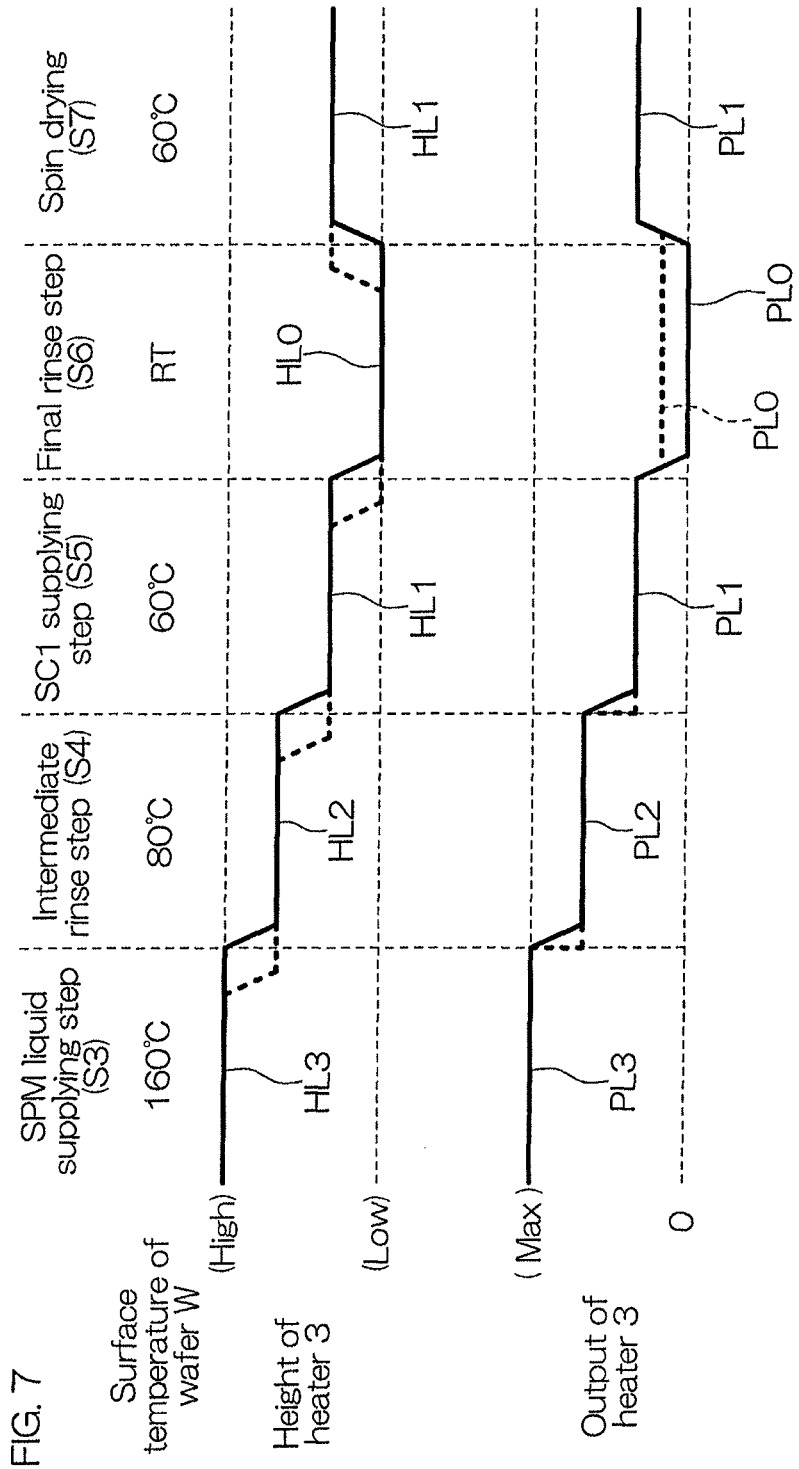
FIG. 7 is a timing chart for illustrating a second processing example of the resist removing processing performed by the substrate processing apparatus shown in FIG. 1.

A second processing example of the resist removing processing performed by the substrate processing apparatus 1 will then be described. FIG. 7 is a timing chart for illustrating the second processing example. In the second processing example, as in the first processing example, the individual steps shown in FIG. 4 are performed. The second processing example differs from the first processing example in that, in each of the steps, not only the spacing between the heater 3 and the wafer W but also the output level of the heater 3 (the outputs of the heater plates 3A, 3B and 3C) is made to differ.

In the second processing example of FIG. 7, in the SPM liquid supplying step (see FIG. 4) in step S3, the output level is set at a third output level PL3 at which the amount of heat generated per unit area of the heater 3 is the largest. In the SPM liquid supplying step, as in the first processing example, the heater 3 is at the third height level HL3. Although variations in temperature of the wafer W are produced through the heating by the heater 3, the surface temperature of the wafer W is heated to about 160° C.

In the intermediate rinse step (see FIG. 4) in step S4, the output level is set at a second output level PL2 at which the amount of heat generated per unit area of the heater 3 is smaller than the third output level PL3. In the intermediate rinse step, as in the first processing example, the heater 3 is at the second height level HL2. Although variations in temperature of the wafer W are produced through the heating by the heater 3, the surface temperature of the wafer W is heated to about 80° C.

In the SC1 supplying step (see FIG. 4) in step S5, the output level is set at a first output level PL1 at which the amount of heat generated per unit area of the heater 3 is smaller than the second output level PL2. In the SC1 supplying step, as in the first processing example, the heater 3 is at the first height level HL1. Although variations in temperature of the wafer W are produced through the heating by the heater 3, the surface temperature of the wafer W is heated to about 60° C.

In the final rinse step (see FIG. 4) in step S6, the output level is set at a zero output level PL0 at which heat is not generated by the heater 3. In the final rinse step, as in the first processing example, the heater 3 is at the zero height level HL0. In this state, the wafer W is not heated by the heater 3. Hence, the surface temperature of the wafer W remains a room temperature (for example, about 25° C., the same temperature as the room temperature (RT) of the processing chamber 6).

At the zero output level PL0, the amount of heat from the heater 3 may be set small such that the radiation heat from the heater 3 located at the zero height level HL0 little affects the wafer W.

As described above, the output level of the heater 3 is minimized when the wafer W is not heated, and thus while the heater 3 is kept in an on-state, it is possible to stop the heating the wafer W. When the heater 3 is temporarily turned off, it may be necessary to take a long time to increase the temperature of the heater 3 to a high temperature when the wafer W is heated again. On the other hand, in this case, the heater 3 is not turned off, and thus thereafter, it is possible to reduce a time necessary to increase the temperature when the wafer W is heated again.

It is a matter of course that even when the output level of the heater 3 is any one of the output levels PL0, PL1, PL2 and PL3, the amount of heat generated per unit area of the third opposing surface 29C is set larger than the amount of heat generated per unit area of the second opposing surface 29B, and the amount of heat generated per unit area of the second opposing surface 29B is set larger than the amount of heat generated per unit area of the first opposing surface 29A.

Although as indicated by solid lines of FIG. 7, the output level of the heater 3 can be gradually changed (over a long time), as indicated by dashed lines of FIG. 7, it may be changed rapidly (in an extremely short time).

Furthermore, although as indicated by the solid lines of FIG. 7, the height position of the heater 3 may be changed simultaneously when the output level of the heater 3 is changed, as indicated by the dashed lines of FIG. 7, it may be changed before the change of the output level of the heater 3.

Figure 8:
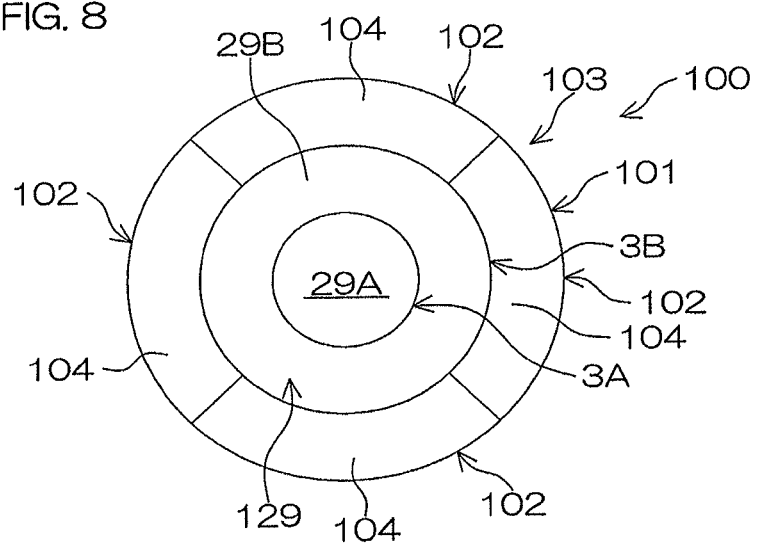
FIG. 8 is a plan view schematically showing the arrangement of a substrate processing apparatus according to a second preferred embodiment of the present invention.

FIG. 8 is a plan view schematically showing the arrangement of a substrate processing apparatus 100 according to a second preferred embodiment of the present invention. In FIG. 8, portions corresponding to the portions indicated in the first preferred embodiment described above are identified with the same symbols as in FIGS. 1 to 7, and their description will be omitted.

The substrate processing apparatus 100 differs from the substrate processing apparatus 1 according to the first preferred embodiment in that, instead of the heater 3, a heater 103 is provided. As with the heater 3, the heater 103 has a disk shape whose diameter is substantially equal to that of the wafer W or is slightly smaller than that of the wafer W, and has a horizontal position. The heater 103 includes, instead of the third heater plate 3C, a heater plate 101 consisting of a plurality of (in FIG. 8, for example, four) divided members 102. Each of the divided members 102 is arc plate-shaped and has the same elements. A plurality of (four) divided members 102 are combined, and thus the annular heater plate 101 is formed. As with the first heater plate 3A, each of the divided members 102 is a resistor-type ceramic heater in which a resistor is incorporated in a main body made of ceramic. On the surface of each of the divided members 102, an opposing region (divided region) 104 opposite the lower surface of the wafer W held by the spin chuck 2 is formed. A plurality of opposing regions 104 constitute an opposing surface 129.

In this case, power is individually supplied to the resistor of each of the divided members 102, and the amount of power supplied to each of the resistors is individually controlled. Hence, it is possible to individually control the amount of heat generated on the opposing region 104 of each of the divided members 102 (the surface temperature of the divided members 102).

In the second preferred embodiment, the opposing surface 129 of the heater 103 is divided into a plurality of opposing regions 104 in a circumferential direction, and the temperatures of the opposing regions 104 are individually adjusted. In this way, even when as in the heater 103, the opposing surface 129 has a larger area, it is possible to maintain the opposing surface 129 at a uniform temperature in the circumferential direction. Hence, it is possible to maintain the entire area of the opposing surface 129 at a uniform temperature.

Incidentally, even when such an arrangement is adopted, minute variations in temperature may be produced in the individual portions of the opposing surface 129 in the circumferential direction. However, in the SPM liquid supplying step (S3), the intermediate rinse step (S4), the SC1 supplying step (S5) and the spin drying (S7), in which the wafer W is heated, the wafer W is rotated with respect to the heater 103, and the opposing regions 104 opposite a predetermined position on the surface of the wafer W are changed one after another. Hence, the temperatures of the opposing regions 104 are made roughly uniform, and thus it is possible to maintain the uniformity of the surface temperature of the wafer W. Due to the reasons described above, the amounts of heat generated by the opposing regions 104 (the amounts of heat given to the wafer W) are not required to be exactly uniform, it is possible to simplify the temperature control of the opposing regions 104.

The arrangement of the heater plate 101 is not limited to the arrangement in which the heater plate 101 is divided into a plurality of divided members 102, and it may adopt an arrangement in which a plurality of resistors are incorporated in one annular main body and it is possible to individually control the amount of power supplied to each of the resistors.

Figure 9:
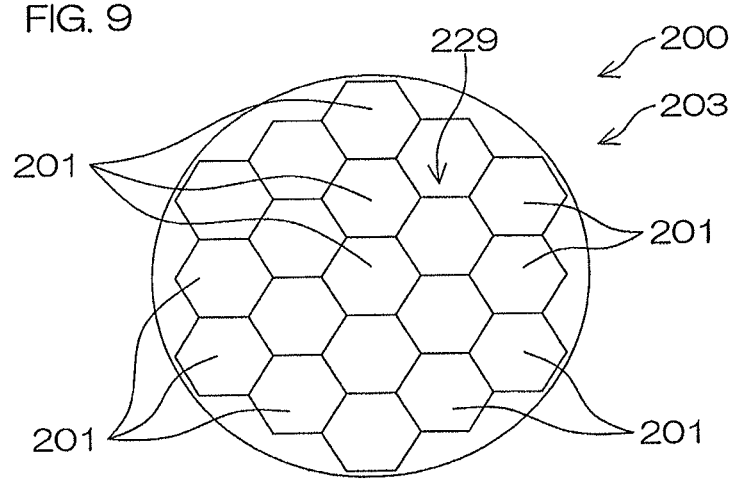
FIG. 9 is a plan view schematically showing the arrangement of a substrate processing apparatus according to a third preferred embodiment of the present invention.

FIG. 9 is a plan view schematically showing the arrangement of a substrate processing apparatus 200 according to a third preferred embodiment of the present invention.

The substrate processing apparatus 200 differs from the substrate processing apparatus 1 according to the first preferred embodiment in that, instead of the heater 3, a heater 203 is provided. As with the heater 3, the heater 203 has a disk shape whose diameter is substantially equal to that of the wafer W or is slightly smaller than that of the wafer W, and has a horizontal position. In the opposing surface 229 of the heater 203, a large number of honeycomb-shaped heater portions 201 are formed in which the opposing surface 229 is divided into the radial direction and the circumferential direction. Each of the heater portions 201 has the same elements. In each of the heater portions 201, a resistor is disposed. Power is individually supplied to the resistors of the heater portions 201, and the amount of power supplied to the resistors is individually controlled. Hence, it is possible to individually control the amount of heat generated by the heater portions 201 (the surface temperature of the heater portions 201).

In the third preferred embodiment, the opposing surface 229 of the heater 203 is divided into a plurality of heater portions 201 both in the circumferential direction and in the radial direction, and the heater portions 201 are individually adjusted in temperature. In the third preferred embodiment, the temperature of the plurality of heater portions 201 (the amount of heat generated per unit area) is set such that as the opposing surface extends away from the rotation axis A1, it is increased. In other words, as in the first preferred embodiment, in the opposing surface 229, a temperature distribution is formed in which as the opposing surface extends away from the rotation axis A1, the temperature is increased. Hence, the temperature of the processing liquid (the SPM liquid, the SC1 or the like) flowing on the surface of the wafer W can be made uniform over the entire area of the wafer W, and the uniform processing using the processing liquid can be performed over the entire surface of the wafer W.

The temperature of the plurality of heater portions 201 (the amount of heat generated per unit area) is set at a uniform temperature in the circumferential direction. Since the individual portions of the opposing surface 229 are individually controlled to have the uniform temperature in the circumferential direction, even when as in the heater 203, the opposing surface 229 has a larger area, it is possible to maintain the opposing surface 229 at the uniform temperature in the circumferential direction.

Incidentally, even when such an arrangement is adopted, minute variations in temperature may be produced in the individual portions of the opposing surface 229. However, in the SPM liquid supplying step (S3), the intermediate rinse step (S4), the SC1 supplying step (S5) and the spin drying (S7), in which the wafer W is heated, the wafer W is rotated with respect to the heater 203, and the heater portions 201 opposing a predetermined position on the surface of the wafer W are changed one after another. Hence, the temperatures of the heater portions 201 are made roughly uniform, and thus it is possible to maintain the uniformity of the surface temperature of the wafer W. Due to the reasons described above, the amounts of heat generated by the heater portions 201 (the amounts of heat given to the wafer W) are not required to be exactly uniform, it is possible to simplify the temperature control of the heater portions 201.

The substrate holding means is not limited to the arrangement in which the spin base such as the spin base is included.

Figure 10:
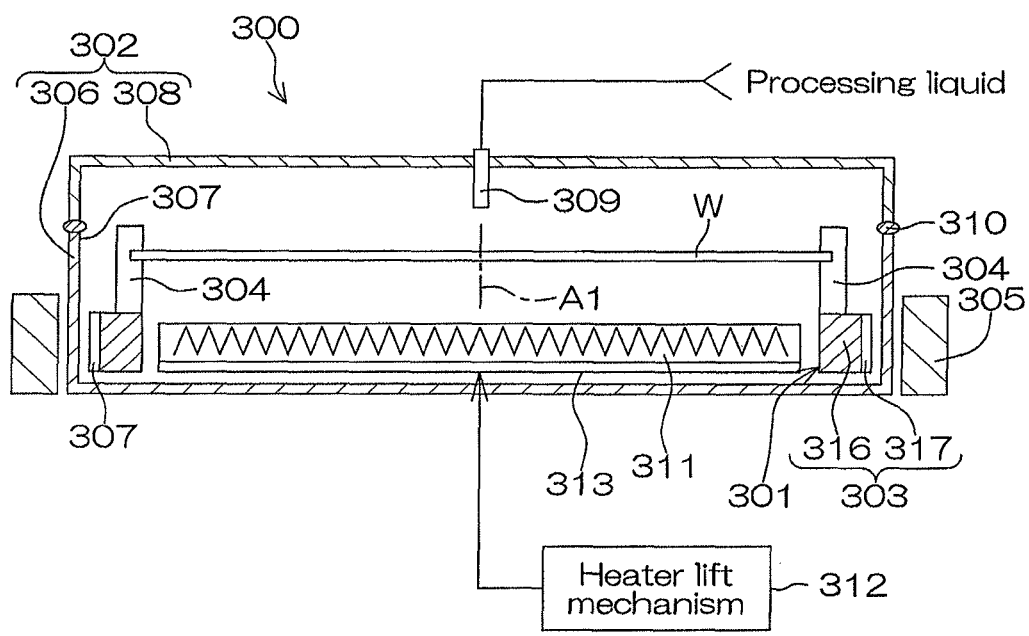
FIG. 10 is a plan view schematically showing the arrangement of a substrate processing apparatus according to a fourth preferred embodiment of the present invention.

FIG. 10 is a cross-sectional view schematically showing the arrangement of a substrate processing apparatus 300 according to a fourth preferred embodiment of the present invention.

The substrate processing apparatus 300 mainly differs from the substrate processing apparatus 1 according to the first preferred embodiment in that, as the substrate holding means, a spin chuck (substrate holding means) 301 not including the spin base is included. The substrate processing apparatus 300 significantly differs from the substrate processing apparatus 1 in that the spin chuck 301 is housed in a sealed chamber 302 having a hermetically sealed internal space.

The spin chuck 301 includes an annular-plate-shaped motor rotor (substrate rotating means) 303 that is rotatably provided with the vertically extending rotation axis A1 as the rotation center, a plurality of (for example, six) clamping members 304 that are disposed on the upper surface of the motor rotor 303 and an annular motor stator 305 (substrate rotating means) that is disposed outside the sealed chamber 302 so as to surround the side of the motor rotor 303. The motor stator 305 is annular with the rotation axis A1 as the rotation center, and the inner circumference of the motor stator 305 is disposed with a minute spacing apart from the outer circumference of the motor rotor 303.

The motor rotor 303 includes a back yoke 316 and a magnet 317. The back yoke 316 is a magnetic component that prevents the leakage of magnetic flux to maximize the magnetic force of the magnet 317. The back yoke 316 is annular and has a predetermined thickness in the axial direction. A plurality of magnets 317 are provided and are attached such that they are aligned in the circumferential direction on the outer circumferential surface of the back yoke 316.

The motor stator 305 is arranged with an unillustrated coil or the like, clamps a cup 306, which will be subsequently described and surrounds the motor rotor 303.

The spin chuck 301 brings the clamping members 304 into contact with the peripheral edge surface of the wafer W, and thereby can hold the wafer W by sandwiching it from the circumference. Then, with the wafer W held by the plurality of clamping members 304, power is supplied from an unillustrated power supply to the motor rotor 303 and the motor stator 305, and thus the wafer W is rotated together with the motor rotor 303 around the vertical rotation axis A1 passing through the center of the wafer W.

The sealed chamber 302 is arranged by combining the bottomed-cylindrical cup 306 in which the spin chuck 301 is housed and a lid member 308 which blocks the upper portion opening 307 of the cup 306. In the cup 306, the motor rotor 303 and the clamping members 304 of the spin chuck 301 are disposed to be housed, and in particular, the motor rotor 303 is disposed in a position close both to the bottom wall of the cup 306 and to the outer circumferential wall of the cup 306.

The lid member 308 is bottomed-cylindrical with an opening facing downward. In the lid member 308, a processing liquid nozzle (processing liquid supplying means) 309 is inserted through a position on the rotation axis A1 of the wafer W. The processing liquid including the SPM liquid, the high-temperature DIW, the SC1 and the DIW described above is supplied to the processing liquid nozzle 309, and the processing liquid is discharged from a discharge port formed in the lower end of the processing liquid nozzle 309.

In the lower end of the outer circumferential wall of the lid member 308, a sealing ring 310 is provided over the entire circumference. When the lid member 308 is at the closed position, the lower end of the outer circumferential wall of the lid member 308 and the upper end of the outer circumferential wall of the cup 306 are brought into contact through the sealing ring 310, and thus the interior of the sealed chamber 302 arranged with the lid member 308 and the cup 306 is kept a hermetically sealed space.

The substrate processing apparatus 300 includes a heater 311 that is disposed opposite the lower surface of the wafer W held by the spin chuck 301 and that heats the wafer W from below, a heater stage 313 that supports the heater 311 from below and a heater lift mechanism (moving means) 312 that raises and lowers the heater 311 while maintaining the horizontal position. The heater 311 is disposed in a region inside the motor rotor 303 in plan view, and has the same arrangement as the heater 3 of the first preferred embodiment. The heater lift mechanism 312 is arranged with, for example, a ball screw and a motor. The heater lift mechanism 312 is coupled to the heater stage 313 and raises and lowers the heater 311 together with the heater stage 313.

In the substrate processing apparatus 300, for example, various types of processing such as the first processing example and the second processing example described above are performed. In this case, as in the first preferred embodiment, by the drive of the heater lift mechanism 312, the heater 311 is raised and lowered between the zero height position (leaving position, see FIG. 6A and the like) HL0 and the third height position (close position, see FIG. 6B and the like) HL3. Specifically, the height position of the heater 311 is switched between the zero height level HL0, the first height level HL1 (see FIG. 6F and the like), the second height level HL2 (see FIG. 6D and the like) and the third height level HL3. In other words, the spacing between the heater 311 and the wafer W can be changed.

In the fourth preferred embodiment, when the spacing between the heater 311 and the wafer W is narrow, the wafer W is heated by the heater 311 to a high temperature. Then, in this state, the spacing between the heater 311 and the wafer W is increased, and thus it is possible to reduce the amount of heat given to the wafer W, with the result that it is possible to cool the wafer W. It is also possible to achieve the same action effects as described in the first preferred embodiment.

Although the four preferred embodiments of the present invention have been described above, the present invention can also be practiced with other preferred embodiments.

For example, the fourth preferred embodiment can be combined with the second preferred embodiment or the third preferred embodiment. In other words, instead of the heater 311 in the fourth preferred embodiment, it is possible to adopt the heater 103 in the second preferred embodiment or the heater 203 in the third preferred embodiment.

Although in the first and second preferred embodiments, it has been described that the heater 3 or 103 is arranged with a plurality of plate heaters 3A, 3B, 3C and 101, the arrangement of a heater may be adopted in which a plurality of resistors are incorporated into a disk-shaped main body and the amount of power supplied to the resistors can be individually controlled.

Although in the second preferred embodiment, the arrangement in which the third opposing surface 29C is divided has been described as an example, the first opposing surface 29A or the second opposing surface 29B may be divided.

As indicated by a dashed line in FIG. 1, a temperature sensor 300 is incorporated into the heater 3, 103, 203 or 311, and when a temperature detected by the temperature sensor 300 is lowered to a previously determined temperature, the subsequent processing (for example, the intermediate rinse processing in step S6) may be performed.

Although as the heaters 3, 103, 203 and 311, the resistor-type ceramic heater has been described as an example, an infrared heater such as a halogen lamp can be adopted as the heater.

Although the case where in order to change the spacing between the heater 3, 103, 203 or 311 and the wafer W, the heater 3 is raised and lowered has been described as an example, the spin chuck 2 may be raised and lowered. Both the heater 3 and the spin chuck 2 may be raised and lowered.

In the SPM liquid supplying step in step S3 in the first and second processing examples, the first chemical liquid nozzle 4 is made to reciprocate between the rotation center of the wafer W and the peripheral edge portion, and thus a supply position on the surface of the wafer W to which the SPM liquid is guided from the first chemical liquid nozzle 4 may reciprocate within a range from the rotation center of the wafer W to the peripheral edge portion of the wafer W while drawing an arc-shaped trail intersecting the direction of the rotation of the wafer W. In this case, the SPM liquid can be supplied more uniformly over the entire surface of the wafer W.

In the SC1 supplying step of step S5 in the first and second processing examples, the second chemical liquid nozzle 5 is made to reciprocate between the rotation center of the wafer W and the peripheral edge portion, and thus a supply position on the surface of the wafer W to which the SC1 is guided from the second chemical liquid nozzle 5 may reciprocate within the range from the rotation center of the wafer W to the peripheral edge portion of the wafer W while drawing an arc-shaped trail intersecting the direction of the rotation of the wafer W. In this case, the SC1 can be supplied more uniformly over the entire surface of the wafer W.

Although in the preferred embodiments described above, the case where a scan nozzle is adopted as the first and second chemical liquid nozzles 4 and 5 has been described as an example, the first and second chemical liquid nozzles 4 and 5 may be a fixed nozzle. In this case, the first and second chemical liquid nozzles 4 and 5 are fixed and disposed above the spin chuck 2 with the discharge port thereof facing the center portion on the upper surface of the wafer W held by the spin chuck 2.

Although in the preferred embodiments described above, the case where the substrate processing apparatus 1, 100, 200 or 300 is used to perform the resist removing processing on the wafer W has been described as an example, the invention can be applied to a substrate processing apparatus used on other processing. In this case, as the chemical liquid used in the processing, a chemical liquid corresponding to the details of processing on the surface of the wafer W is used. For example, when cleaning processing that removes particles from the surface of the wafer W is performed, the SC1 (ammonia-hydrogen peroxide mixture) or the like is used. Moreover, when cleaning processing that etches an oxide film or the like from the surface of the wafer W is performed, hydrofluoric acid, BHF (Buffered HF) or the like is used, and when polymer removing processing is performed that removes a resist residue which is left as a polymer on the surface of the wafer W after peeling the resist, a polymer removing liquid such as the SC1 is used. For cleaning processing that removes a metal contaminant, hydrofluoric acid, SC2 (hydrochloric acid/hydrogen peroxide mixture), the SPM liquid (sulfuric acid/hydrogen peroxide mixture) or the like is used.

Although in this case, the case where the DIW is used as the rinse liquid has been described as an example, the rinse liquid is not limited to the DIW, and as the rinse liquid, carbonated water, electrolytic ion water, ozone water, hydrochloric acid water of dilution concentration (for example, about 10 to 100 ppm), reduced water (hydrogen water) or the like can be adopted.

Although the preferred embodiments of the present invention have been described in detail, these are simply specific examples used to clarify the technical details of the present invention, the present invention should not be interpreted as these specific examples alone and the scope of the present invention is limited by only the scope of Claims accompanied.

This application corresponds to Japanese Patent Application No. 2012-229139 filed in Japan Patent Office on Oct. 16, 2012, and all the disclosure of this application is incorporated herein by reference.

REFERENCE SIGNS LIST 1, 100, 200, 300 substrate processing apparatus
2, 301 spin chuck
3, 103, 203, 311 heater
4 first chemical liquid nozzle
5 second chemical liquid nozzle
12 spin base
13 clamping member
14 spin motor
23 heater lift mechanism
25 support rod
29, 129, 229 opposing surface
29A first opposing surface
29B second opposing surface
29C third opposing surface
30 room-temperature rinse liquid nozzle
35 high-temperature rinse liquid nozzle
39 space
104 opposing region (divided region)
303 motor rotor
305 motor stator
309 processing liquid nozzle
312 heater lift mechanism
313 heater stage
A1 rotation axis
W wafer

The invention claimed is:

1. A substrate processing method comprising:
a substrate holding step of holding a substrate horizontally by a substrate holding-unit holder;
a first arrangement step of placing a relative position of the substrate and a heater which is disposed in the substrate holder in a space that is covered from above by the substrate, and is opposed to a lower surface of the substrate and that heats the substrate from below by radiant heat, to a first position;
a first supply step of supplying a first processing liquid only toward an upper surface of the substrate in a state where the relative position of the substrate and the heater is the first position;
a second arrangement step of changing the relative position between the substrate and the heater to a second position where an interval between the substrate and the heater is wider than in the first position; and
a second supply step of supplying a second processing liquid different in type from the first processing liquid only toward the upper surface of the substrate in a state where the relative position of the substrate and the heater is the second position,
whereby no liquid is directed toward the lower surface of the substrate in either the first supply step or the second supply step.

2. The substrate processing method according to claim 1, wherein the substrate holder includes a plate-shaped base portion and a substrate support that is attached to the base portion and that supports the substrate while the substrate is spaced apart from the base portion, and
the heater is disposed so as to be housed in a space partitioned by the base portion and the substrate supported by the substrate support.

3. The substrate processing method according to claim 2, wherein the heater is independently supported by a heater supporting member spaced apart from the substrate holder, and
the heater supporting member includes a support rod which is inserted through the base portion without contact with the base portion in a thickness direction and whose one end is coupled to the heater.

4. The substrate processing method according to claim 1, further comprising:
a first output setting step of setting an output of the heater to a first output level determined corresponding to the first processing liquid in parallel with the first supply step; and
a second output setting step of setting an output of the heater to a second output level determined corresponding to the second processing liquid in parallel with the second supply step.

5. The substrate processing method according to claim 4, wherein the first output is higher than the second output.

6. The substrate processing method according to claim 1, wherein the first position is a predetermined position in correspondence with the first processing liquid, and is a position where a temperature of the substrate becomes a first temperature,
the second position is a predetermined position in correspondence with the second processing liquid, and is a position where a temperature of the substrate becomes a second temperature higher than room temperature and lower than the first temperature.

7. The substrate processing method according to claim 1, wherein a predetermined amount of heat is given to the substrate from the heater in a state where the relative position of the substrate and the heater is the first position, and
in a state in which the relative position between the substrate and the heater is arranged in the second position, a lower amount of heat is applied to the substrate than in a state in which said relative position is arranged in the first position.

8. The substrate processing method according to claim 1, method comprising:
a third arrangement step of arranging the relative position between the substrate and the heater at a third position where the interval between the substrate and the heater is narrower than the second position; and
a spin dry step of rotating the substrate at a shake-off speed in a state where the relative position between the substrate and the heater is located at the third position.

9. The substrate processing method according to claim 1, wherein the heater includes an opposing surface that is parallel to and opposite the substrate held by the substrate holder, and
the opposing surface is divided into a plurality of opposing regions wherein respective amounts of heat generated per unit area differ from each other.

10. The substrate processing method according to claim 9, wherein a spin motor is provided for rotating the substrate holder about a rotation axis, and
wherein the respective amounts of heat generated per unit area in the plurality of opposing regions are set such that the respective amounts of heat increase with the distance of the opposing regions away from the rotation axis.

11. The substrate processing method according to claim 9, wherein the plurality of opposing regions include a circular region with the rotation axis as a center and one or a plurality of annular regions that surround an outer circumference of the circular region,
at least one of the annular regions is divided into a plurality of divided regions in a circumferential direction, and
the plurality of divided regions are provided such that in the respective divided regions, the amounts of heat generated per unit area of the opposing surface differ from each other.

12. A substrate processing method comprising:
a substrate holding step of holding a substrate horizontally by a substrate holder;
a first arrangement step of placing a relative position of the substrate and a heater which heats the substrate from below by radiant heat to a first position determined corresponding to the first processing liquid;
a first supply step of supplying the first processing liquid to an upper surface of the substrate in a state where the relative position of the substrate and the heater is the first position;
a first output setting step of setting an output of the heater to supply heat to the substrate at a first output level determined corresponding to the first processing liquid in parallel with the first supply step;
a second arrangement step of changing the relative position between the substrate and the heater to a second position where an interval between the substrate and the heater is wider than the first position, and the second position is determined corresponding to the second processing liquid different in type from the first processing liquid;

a second supply step of supplying the second processing liquid to the surface of the substrate in a state where the relative position of the substrate and the heater is the second position; and a second output setting step of setting an output of the heater to supply heat to the substrate at a second output level determined corresponding to the second processing liquid and weaker than the first output level in parallel with the second supply step.

13. The substrate processing method according to claim 12, wherein the substrate holding unit includes a plate-shaped base portion and a substrate support that is attached to the base portion and that supports the substrate while the substrate is spaced apart from the base portion, and the heater is disposed so as to be housed in a space partitioned by the base portion and the substrate supported by the substrate support.

14. The substrate processing method according to claim 13, wherein the heater is independently supported by a heater supporting member spaced apart from the substrate holder, and the heater supporting member includes a support rod which is inserted through the base portion without contact with the base portion in a thickness direction and whose one end is coupled to the heater.

15. The substrate processing method according to claim 12, wherein the first position is a predetermined position in correspondence with the first processing liquid, and is a position where a temperature of the substrate becomes a first temperature, the second position is a predetermined position in correspondence with the second processing liquid, and is a position where a temperature of the substrate becomes a second temperature higher than room temperature and lower than the first temperature.

16. The substrate processing method according to claim 12, wherein a predetermined amount of heat is given to the substrate from the heater in a state where the relative position of the substrate and the heater is the first position, and in a state in which the relative position between the substrate and the heater is arranged in the second position, a lower amount of heat is applied to the substrate than in a state in which said relative position is arranged in the first position.

17. The substrate processing method according to claim 12, method comprising:

a third arrangement step of arranging the relative position between the substrate and the heater at a third position where the interval between the substrate and the heater is narrower than the second position; and a spin dry step of rotating the substrate at a shake-off speed in a state where the relative position between the substrate and the heater is located at the third position.

18. The substrate processing method according to claim 12, wherein the heater includes an opposing surface that is parallel to and opposite the substrate held by the substrate holder, and the opposing surface is divided into a plurality of opposing regions wherein respective amounts of heat generated per unit area differ from each other.

19. The substrate processing method according to claim 18, wherein a spin motor is provided for rotating the substrate holder about a rotation axis, and wherein the respective amounts of heat generated per unit area in the plurality of opposing regions are set such that the respective amounts of heat increase with the distance of the opposing regions away from the rotation axis.

20. The substrate processing method according to claim 18, wherein the plurality of opposing regions include a circular region with the rotation axis as a center and one or a plurality of annular regions that surround an outer circumference of the circular region, at least one of the annular regions is divided into a plurality of divided regions in a circumferential direction, and the plurality of divided regions are provided such that in the respective divided regions, the amounts of heat generated per unit area of the opposing surface differ from each other.

* * * * *

UNITED STATES PATENT AND TRADEMARK OFFICE
CERTIFICATE OF CORRECTION

| | |
|---|---|
| PATENT NO. | : 10,497,581 B2 |
| APPLICATION NO. | : 15/401892 |
| DATED | : December 3, 2019 |
| INVENTOR(S) | : Hashizume et al. |

Page 1 of 1

It is certified that error appears in the above-identified patent and that said Letters Patent is hereby corrected as shown below:

In the Claims

Claim 1 at Column 21, Line 4, the phrase "by a substrate holding-unit holder" should be --by a substrate holder--.

Signed and Sealed this
Eighteenth Day of February, 2020

Andrei Iancu
*Director of the United States Patent and Trademark Office*